(12) United States Patent
Jung et al.

(10) Patent No.: US 9,371,430 B2
(45) Date of Patent: Jun. 21, 2016

(54) POROUS FILM WITH HIGH HARDNESS AND A LOW DIELECTRIC CONSTANT AND PREPARATION METHOD THEREOF

(71) Applicant: Research & Business Foundation Sungkyunkwan University, Suwon-si (KR)

(72) Inventors: Dong Geun Jung, Seoul (KR); Hoon Bae Kim, Incheon (KR); Hyo Jin Oh, Seongnam-si (KR); Chae Min Lee, Gwacheon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 14/825,823

(22) Filed: Aug. 13, 2015

(65) Prior Publication Data

US 2016/0024267 A1    Jan. 28, 2016

Related U.S. Application Data

(63) Continuation-in-part of application No. 14/178,065, filed on Feb. 11, 2014.

(30) Foreign Application Priority Data

Aug. 19, 2013   (KR) .................. 10-2013-0098177

(51) Int. Cl.
*C08J 9/00* (2006.01)
*H01L 21/02* (2006.01)
*B05D 1/34* (2006.01)
(Continued)

(52) U.S. Cl.
CPC ......... *C08J 9/0014* (2013.01); *H01L 21/02126* (2013.01); *H01L 21/02203* (2013.01); *H01L 21/02205* (2013.01); *H01L 21/02274* (2013.01); *H01L 21/02318* (2013.01); *B05D 1/34* (2013.01); *B05D 1/62* (2013.01); *C08J 2383/04* (2013.01); *H01L 21/67115* (2013.01)

(58) Field of Classification Search
None
See application file for complete search history.

(56) References Cited

U.S. PATENT DOCUMENTS

| | | | |
|---|---|---|---|
| 5,434,008 | A | 7/1995 | Felts |
| 6,169,127 | B1 | 1/2001 | Lohmann et al. |

(Continued)

FOREIGN PATENT DOCUMENTS

| | | |
|---|---|---|
| JP | 2004-161877 A | 6/2004 |
| JP | 2012-21201 A | 2/2012 |

(Continued)

OTHER PUBLICATIONS

Maex, Karen, et al. "Low dielectric constant materials for microelectronics." Journal of Applied Physics 93.11 (2003): 8793-8841.

(Continued)

*Primary Examiner* — Robert S Loewe
(74) *Attorney, Agent, or Firm* — NSIP Law

(57) ABSTRACT

The present invention relates to a plasma polymerized thin film having high hardness and a low dielectric constant and a manufacturing method thereof, and in particular, relates to a plasma polymerized thin film having high hardness and a low dielectric constant for use in semiconductor devices, which has improved mechanical strength properties such as hardness and elastic modulus while having a low dielectric constant, and a manufacturing method thereof.

20 Claims, 19 Drawing Sheets

(51) Int. Cl.
*B05D 1/00* (2006.01)
*H01L 21/67* (2006.01)

(56) References Cited

U.S. PATENT DOCUMENTS

| | | | |
|---|---|---|---|
| 6,321,793 | B1 | 11/2001 | Czaplicki et al. |
| 7,704,894 | B1 | 4/2010 | Henri et al. |
| 7,897,521 | B2 | 3/2011 | Jung et al. |
| 8,017,527 | B1 | 9/2011 | Dhas et al. |
| 8,034,725 | B1 | 10/2011 | Henri et al. |
| 2005/0119394 | A1 | 6/2005 | Sakurai et al. |
| 2005/0276930 | A1 | 12/2005 | Gates et al. |
| 2006/0052566 | A1 | 3/2006 | Sakurai et al. |
| 2008/0260956 | A1 | 10/2008 | Sakurai et al. |
| 2009/0186980 | A1 | 7/2009 | Jung et al. |

FOREIGN PATENT DOCUMENTS

| | | |
|---|---|---|
| KR | 10-2009-0059462 A | 6/2009 |
| KR | 10-2010-0020501 A | 2/2010 |
| KR | 10-2010-0042022 A | 4/2010 |

OTHER PUBLICATIONS

Hnilica, Jaroslav, et al. "PECVD of nanostructured SiO2 in a modulated microwave plasma jet at atmospheric pressure." Journal of Physics D: Applied Physics 46.33 (2013): 335202.

Korean Office Action issued Jul. 3, 2014 in counterpart Korean Application No. KR 10-2013-0098177 (6 pages, in Korean).

Korean Office Action issued Nov. 12, 2014 in counterpart Korean Application No. KR 10-2013-0098177 (4 pages, in Korean).

Korean Notice of Allowance issued Mar. 11, 2015 in counterpart Korean Application No. KR 10-2013-0098177 (4 pages, in Korean).

POROUS FILM WITH HIGH HARDNESS AND A LOW DIELECTRIC CONSTANT AND PREPARATION METHOD THEREOF

CROSS REFERENCE TO RELATED APPLICATIONS

This application claims the benefit of priority to and is a continuation-in-part of U.S. patent application Ser. No. 14/178065, filed on Feb. 11, 2014, which claims the benefit of priority to Korean Patent No. 10-2013-0098177, filed on Aug. 19, 2013, the entire disclosure of both of which are incorporated herein by reference for all purposes.

TECHNICAL FIELD

The present invention relates to a porous film with high hardness and a low dielectric constant formed by plasma polymerization and a preparation method thereof, and in particular, relates to a porous film with high hardness and a low dielectric constant formed by plasma polymerization for use in semiconductor devices as an insulating layer, having improved mechanical strength properties such as hardness and elastic modulus while having a low dielectric constant, and a preparation method thereof.

BACKGROUND ART

Currently, one of the main steps in the manufacture of semiconductor devices is the formation of metal and dielectric thin films on a substrate by a gaseous chemical reaction. This deposition process includes a chemical vapor deposition (CVD). In a typical thermal CVD process, reactant gases are provided to the surface of a substrate, and a predetermined thin film is formed on the surface of the substrate due to the occurrence of a thermally-induced chemical reaction. A thermal CVD process is conducted at a high temperature, and a device having the layer formed on the substrate may be damaged due to the high temperature. One of the methods capable of solving such a problem, that is, among methods in which metals and dielectric films are deposited at a relatively low temperature, is a plasma enhanced CVD (PECVD) method.

According to plasma enhanced CVD technology, radio frequency (RF) energy is applied to a reaction zone, and this promotes the excitation and/or dissociation of reactant gases, thereby generating plasma with highly reactive species. The high reactivity of the species in plasma reduces the energy required for a chemical reaction to take place and thus lowers the temperature required by the process. Semiconductor device structures have significantly decreased in size due to the introduction of this apparatus and method.

Meanwhile, silicon dioxide ($SiO_2$), which has been mainly used as an interlayer insulating film until now, has a resistance-capacitance (RC) delay time when ultra-large scale integrated circuits of 0.5 μm or less are manufactured. Therefore, in order to reduce the RC delay of the multilayer metal film used for integrated circuits of a semiconductor device, research on the formation of an interlayer insulating film used for metal wires with a material having a low relative dielectric constant (k≤3.5) have recently been actively conducted. Such a thin film having a low dielectric constant is formed either with an inorganic material such as a fluorine (F)-doped oxide film (SiOF) and a fluorine-doped amorphous carbon (a-C:F) film, or with an organic material including carbon (C).

Materials having a low dielectric constant currently considered for use as a substitute for $SiO_2$ include SILK (available from DOW Chemical), FLARE (fluorinated poly (arylene ether), available from Allied Signals) and the like, which are mainly formed by spin coating, and SiOF, Black Diamond (available from Applied Materials), Coral (available from Novellus) and the like, which are formed by chemical vapor deposition (CVD). In addition, organic polymers such as polyimide, and porous thin film materials such as xerogel or aerogel are also included.

Herein, the material having a low dielectric constant, which is formed using a spin casting method in which the material is cured after being spin coated, is formed to a dielectric substance having a low dielectric constant since pores having a size of few nanometers (nm) are formed within the film resulting in the density decrease in the thin film. Generally, the polymers deposited by spin coating have advantages in that they usually have a low dielectric constant and excellent planarization. However, polymers are not suitable to be applied to a semiconductor since they have a heat-resistant threshold temperature lower than 450° C., thereby having poor thermal stability, and particularly, polymers have various problems in the manufacture of devices since the mechanical strength of the thin film is low due to the size of the pores being large and the pores not being uniformly distributed within the film. In addition, polymers have problems in that they have poor contact with upper and lower wiring materials, and high stress due to thermal curing. Further, the reliability of devices is reduced due to dielectric constant changes attributable to the absorption of water present in the surroundings.

Meanwhile, the inventors of the present invention have conducted a study on a thin film using a PECVD method with hexamethyldisiloxane and 3,3-dimethyl-1-butene as precursors, and considerably improved the dielectric constant of the thin film (Korean Patent Number 10-0987183). However, there remained a problem in that the mechanical properties of the thin film were not satisfactory.

DISCLOSURE

Technical Problem

In view of the above, the inventors of the present invention have verified that, when a film is prepared by depositing a cross-shaped precursor, mechanical strength properties such as hardness and elastic modulus are considerably improved compared to conventional thin films while still maintaining a low electric constant, by introducing pores due to adjusting a reaction condition, such as power of applied plasma, pressure inside reactor, etc., or annealing of a plasma polymerized film further comprising a hydrocarbon compound. The present invention is based on this discovery.

Technical Solution

A first aspect of the present invention provides a porous film with high hardness and a low dielectric constant formed by plasma polymerization using a compound represented by the following Chemical Formula 1 as a precursor:

[Chemical Formula 1]

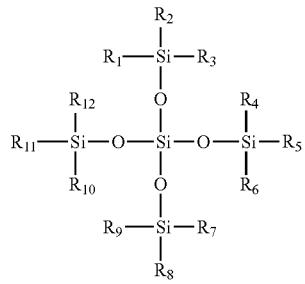

in the formula, $R_1$ to $R_{12}$ are each independently H or $C_1$-$C_5$ alkyl, wherein a relative dielectric constant of the porous film is controlled within the range from 1.5 to 3.5 by introducing pores and the hardness of the porous film is controlled within the range from 0.1 GPa to 10 GPa.

A second aspect of the present invention provides a method for preparing a porous film with high hardness and a low dielectric constant formed by plasma polymerization, comprising: depositing a porous film on a substrate by polymerizing a compound represented by Chemical Formula 1 as a precursor through plasma in a reactor with a controlled pressure under 750 mTorr.

A third aspect of the present invention provides a method for preparing a porous film with high hardness and a low dielectric constant formed by plasma polymerization, comprising: 1) depositing a plasma polymerized film on a substrate by polymerizing a compound represented by Chemical Formula 1 as a precursor with a hydrocarbon compound as an additional precursor through plasma; and 2) annealing the deposited film to sublimate the hydrocarbon compound, thereby forming pores.

A fourth aspect of the present invention provides a semiconductor device with an insulating layer consisting of the porous film of the first aspect.

Hereinafter, the present invention will be described in detail.

In the present invention, a cross-shaped precursor represented by Chemical Formula 1 may be used as a precursor for forming a porous film, and the porous film having improved mechanical strength while maintaining a low dielectric constant can be provided by depositing the film via a plasma polymerization of the precursor under controlled conditions or with the help of annealing following film-deposition via polymerization of the precursor with a hydrocarbon compound as an additional precursor. The porous film according to the present invention has high hardness and elastic modulus, and therefore, improvement in chemical mechanical planarization (CMP) process is possible, and since the porous film also has a low dielectric constant, resistance-capacitance (RC) delay time occurring in the manufacture of ultra-large scale integrated circuits can be reduced.

Specifically, the pores can be formed by performing plasma polymerization in a reactor with a controlled pressure under 750 mTorr, or by annealing the film formed via plasma polymerization using the precursor with a hydrocarbon compound as an additional precursor. The pores may refer to atomic or molecular level vacancies, but not limited thereto.

Furthermore, a method for preparing the porous film according to the present invention can simplify pre- and post-treatments or complicated related processes which occur in spin casting methods. In addition, the plasma polymerized porous film prepared by the method can have the improved properties through controlling polymerization conditions or annealing the polymerized film using a rapid thermal annealing (RTA) apparatus.

The precursor according to the present invention, which is represented by Chemical Formula 1, has a feature of the whole compound structure forming a cross shape in which a Si atom at the center is linked to oxygen atoms in four directions. Specifically, the precursor has a structure having Si—O—Si as a backbone and 4 alkylsilyl groups such as trialkylsilyl as branches, which can form cages, i.e. nanometer-sized pores, by plasma polymerization, thereby lowering a dielectric constant of the prepared film. Under relatively low pressure and plasma power, the precursor can be dissociated to form trialkylsilyl. However, relatively high pressure and plasma power further dissociate trialkylsilyl into even smaller fragments, thereby hardly forming cages in the film prepared therefrom.

In another case, in the film prepared using the precursor, Si—O bonding can be solidly maintained compared to other bonding due to such structural characteristics. Therefore, improvement in the hardness and the elastic modulus of the porous film can be maintained even after the film is annealed, and thereby a hydrocarbon compound, used as an additional precursor to be plasma polymerized together, is sublimated and pores are left where it was present. Thus, in the present invention, the film can be deposited using the precursor and an additional precursor, which is a hydrocarbon in a liquid state, at the same time, and in this case, cross-linking between the precursor molecules and the additional precursor molecules can readily occur. Therefore, when the thin film is deposited combining these precursors, complex cross-linking is possible, and further, polymer polymerizations by plasma can readily occur. The plasma polymerized thin film according to the present invention, which is manufactured as above, can have excellent thermal stability and improved mechanical properties while maintaining a low dielectric constant.

The porous film with high hardness and a low dielectric constant formed by plasma polymerization according to the first aspect of the present invention is prepared using a precursor represented by the following Chemical Formula 1.

[Chemical Formula 1]

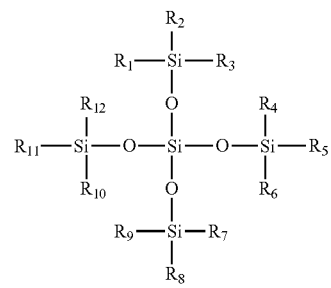

In the formula, $R_1$ to $R_{12}$ are each independently H or $C_1$-$C_5$ alkyl.

Furthermore, the porous film with high hardness and a low dielectric constant formed by plasma polymerization may be prepared using an additional precursor, which is a hydrocarbon in a liquid state present within a bubbler of a plasma polymerization apparatus, together with the precursor.

Regarding the precursor, $R_1$ to $R_{12}$ in Chemical Formula 1 may be each independently H or $C_1$-$C_5$ alkyl, and examples of the alkyl include methyl, ethyl, propyl, butyl and the like. These alkyls may be linear or branched.

In one example of the present invention, the precursor represented by Chemical Formula 1 may be tetrakis(trimethylsilyloxy)silane in which each of $R_1$ to $R_{12}$ is methyl as represented by the following Chemical Formula 2.

[Chemical Formula 2]

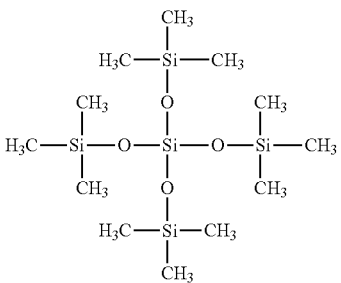

The precursor may be deposited together with an additional precursor.

The precursor and the additional precursor can be provided as a type of solution filled in a first bubbler and a second bubbler, respectively. For example, the additional precursor may be a hydrocarbon in a liquid state present within a bubbler of a plasma polymerization apparatus. When the additional precursor is a hydrocarbon, it has advantages in that the additional precursor can show favorable linking power with the precursor, the plasma polymerized film is readily formed, and the hardness and the elasticity of the film are improved due to the presence of multiple $C-H_x$ bonding structures. Furthermore, the plasma polymerized film of the present invention may be formed using a plasma polymerization apparatus (for example, a PECVD apparatus), and therefore, the additional precursor is preferably a hydrocarbon that can be in a liquid state within the bubbler of the plasma polymerization apparatus. The bubbler can store a precursor and also vaporize the precursor present inside. The bubbler can store a greater amount of the precursor when the precursor is in a liquid state than in a gas state, and it may be suitable considering the liquid vaporization function of the bubbler. Generally, the conditions within the bubbler may be standard (25° C. and 1 atmosphere), however, the conditions may also be 250° C. or less and 5 atmosphere or less by controlling the temperature and the pressure.

The additional precursor is not particularly limited as long as it is a hydrocarbon in a liquid state present within the bubbler, however, more specifically, it may include a hydrocarbon such as a $C_6$-$C_{12}$ alkane, an alkene, a cycloalkane, a cycloalkene or a mixture thereof. If the carbon number of the additional precursor is less than $C_6$, it is difficult for the additional precursor to be in a liquid state in standard conditions, and therefore, the temperature needs to be lowered and the pressure must be raised within the bubbler, and since the additional precursor has a low molecular weight, the cross-linking power with the precursor decreases and as a result, there may be a problem in that the thin film is not readily deposited. Meanwhile, if the carbon number of the additional precursor is greater than $C_{12}$, the additional precursor can be in a solid state in normal conditions, therefore the temperature needs to be raised and the pressure lowered within the bubbler, and there may be a problem in that it is difficult for evaporation to occur in the bubbler.

One preferable example of the additional precursor includes cyclohexane, which is a ring-shaped organic compound, but the precursor is not limited thereto.

The precursor and the additional precursor can be combined at the same time and used, and they can readily form cross-linking due to their chemical and structural characteristics as described above to thereby increase the stability of the thin film, and therefore, a plasma polymerized thin film having improved mechanical properties while maintaining a low dielectric constant can be provided. Furthermore, the additional precursor can be sublimated by annealing, thereby producing pores where it is.

The porous film according to the present invention may be prepared by a polymerization reaction using plasma. In this case, it may be additionally used together with the additional precursor. Specifically, by the plasma generated within a reactor for plasma deposition, the film may be formed through polymerization between the precursors or between the precursor and the additional precursor. The polymerization reaction using plasma can form the thin film on a substrate within a reactor by the precursor and the additional precursor being effectively polymerized and deposited through the generation of plasma including highly reactive species. Based on the principle described above, as shown in FIG. 9, the polymerization reaction using plasma has higher cross-linking density compared to general polymerization reactions. Furthermore, when the plasma polymerized film is formed, a gap of a nanometer size or less may be formed resulting in the reduction of the dielectric constant and the improvement in the mechanical properties. One example of the polymerization reactions using plasma includes a plasma enhanced chemical vapor deposition (PECVD) method.

When the film is formed through the polymerization reaction using plasma, the film made of the precursor and the additional precursor in a certain ratio may be formed by supplying those precursors in the certain ratio into a reactor. Furthermore, the supplied amount or the intended ratio of the supplied precursor to the additional precursor may be controlled by adjusting the temperature of a bubbler, or the flow rate of a carrier gas such as helium (He). For example, a ratio of the precursor and the additional precursor injected into the reactor corresponds to the flow rate ratio of a first and a second carrier gas, with which the precursor and the additional precursor can be respectively delivered to the reactor, and is thereby adjusted by the flow rate ratio of a first (bubbler temperature 90° C.) and a second carrier gas (bubbler temperature 55° C.) and is controlled within a range of 1:1 to 1:5. If the flow rate ratio of the second carrier gas is greater than 5 times with respect to the first carrier gas, SiOx within the thin film is significantly reduced and the thin film is difficult to use as an interlayer insulating film, and if the flow rate ratio of the second carrier gas is less than the flow rate ratio of the first carrier gas, the dielectric constant or the mechanical strength may not be significantly improved.

Furthermore, the plasma polymerized thin film may be annealed using an RTA apparatus after being deposited through the polymerization reaction using plasma. By conducting the annealing, it was verified that the dielectric constant of the plasma polymerized thin film according to the present invention significantly decreased (FIG. 4).

The plasma polymerized thin film according to the present invention manufactured using the method and the precursor as above may have a thickness ranging from 0.1 μm to 1.5 μm. If the thickness is less than 0.1 μm, there may be a problem in that there may be difficulties in manufacturing and processing, and the hardness of the thin film may be reduced, and if the thickness is greater than 1.5 μm, manufacturing costs may increase and there may be difficulties in manufacturing ultra-large scale integrated circuits. Furthermore, the plasma polymerized thin film according to the present invention may have high hardness and a low dielectric constant, with the mechanical strength (hardness) ranging from 0.1 GPa to 10 GPa and the relative dielectric constant ranging from 1.5 to 3.5.

A second aspect of the present invention is a method for preparing a porous film with high hardness and a low dielectric constant formed by plasma polymerization, comprising: 1) depositing a porous film on a substrate by polymerizing a compound represented by Chemical Formula 1 as a precursor through plasma in a reactor with a controlled pressure under 750 mTorr.

A third aspect of the present invention is a method for preparing a porous film with high hardness and a low dielectric constant formed by plasma polymerization, comprising: 1) depositing a plasma polymerized film on a substrate by polymerizing a compound represented by Chemical Formula 1 as a precursor with a hydrocarbon compound as an additional precursor through plasma; and 2) annealing the deposited film to sublimate the hydrocarbon compound, thereby forming pores.

Furthermore, the step 1) may be depositing the plasma polymerized thin film on a substrate by polymerizing the precursor as itself or together with an additional precursor, which is a hydrocarbon in a liquid state present within a bubbler of a plasma polymerization apparatus.

The precursor, the additional precursor, the porous film and the like in the method for preparing the porous film according to the present invention are the same as those described above in the first aspect.

The step 1) is a step in which the plasma polymerized film is formed on a substrate by polymerizing and depositing the precursor under plasma using a plasma polymerization apparatus, and at this time, the additional precursor may be used together.

Herein, the step 1) comprises A) vaporizing the precursor in a bubbler; B) supplying the vaporized precursor into a reactor for plasma deposition from the bubbler with a carrier gas; and C) forming the plasma polymerized film on the substrate in the reactor using the plasma of the reactor.

One example of the plasma polymerization apparatus includes a PECVD apparatus using a PECVD method. The apparatus conducts a thin film deposition process through a process chamber constituted of an upper chamber lid and a lower chamber body, that is, a reactor. The thin film is deposited by uniformly spraying reactant gases onto a substrate, which is safely placed on the upper surface of a susceptor formed in the chamber body, through shower heads formed inside the chamber lid, and the thin film deposition process is progressed by this reaction being activated by the radio frequency (RF) energy supplied through an electrode mounted in the susceptor.

The step 2) is a step in which the thin film deposited in the step 1) is annealed using an RTA apparatus. The RTA apparatus is an annealing apparatus, and a substrate and the thin film deposited thereon are placed on the susceptor within the RTA apparatus, after which the annealing process is rapidly conducted at a predetermined temperature. Specifically, the step 2) can be performed by heat treatment of plasma polymerized film on a substrate at 300° C. to 600° C.

Hereinafter, the method for preparing a porous film according to one example of the present invention will be described in more detail with reference to accompanying drawings.

FIG. 1 schematizes a plasma enhanced CVD apparatus used for preparing the porous film with high hardness and a low dielectric constant formed by plasma polymerization according to one example of the present invention.

The PECVD apparatus may include a capacitively coupled PECVD apparatus shown by a diagram in FIG. 1, but is not limited thereto, and all other types of PECVD apparatuses may be used.

The apparatus includes first and second carrier gas storage units (10, 11) containing a carrier gas such as He, first and second flow rate controllers (20, 21) for controlling the number of moles of gases passing therethrough, first and second bubblers (30, 31) containing solid or liquid precursors, a reactor (50) in which the reaction is progressed, and a radio frequency (RF) generator (40) for generating plasma in the reactor (50). The carrier gas storage units (10, 11), the flow rate controllers (20, 21), the bubblers (30, 31), and the reactor (50) are connected through a pipeline (60). In the reactor (50), a susceptor (51), which generates plasma around by being connected to the RF generator (40) and on which a substrate (1) may be placed, is provided. A heater (not shown) is embedded inside the susceptor (51) so as to heat the substrate (1) safely placed on the upper surface of the susceptor (51) to a temperature appropriate for deposition in the thin film deposition process. An exhaust system is provided under the reactor (50) so as to exhaust the reactant gases remaining in the reactor (50) after the deposition reaction has completed.

According to the above, an example of the method of depositing the thin film using a PECVD apparatus is as follows.

First, a substrate (1) made of silicon ($P^{++}$—Si) implanted with boron having metallic properties is washed with trichloroethylene, acetone, methanol and the like, and then placed on the susceptor (51) of the reactor (50).

The first and the second bubblers (30, 31) respectively contain the precursor and the additional precursor, and the first and the second bubblers (30, 31) are heated to temperatures sufficient to vaporize each precursor. Herein, each precursor can be contained in any one of the two bubblers (30, 31), and the heating temperature of each bubbler may be controlled depending on the types of precursors received in the bubbler.

Each first and second carrier gas storage unit (10, 11) may contain argon (Ar), helium (He), neon (Ne) or a gas combining these as a carrier gas, and the carrier gas flows via the pipeline (60) by means of the first and the second flow rate controllers (20, 21). The carrier gas flowing along the pipeline (60) generates bubbles by being introduced into the precursor solution of the bubblers (30, 31) via the bubbler inlet ports, and then flows into the pipeline (60) again loading the gaseous precursors via the bubbler outlet ports. At this time, the ratio of the first and the additional precursor supplied into the reactor may be adjusted by adjusting the flow rate of the first and the second carrier gas. More specifically, the first and the additional precursor may be supplied into the reactor with the flow rate ratio of the first carrier gas:the second carrier gas ranging from 1:1 to 1:5, but the flow rate ratio is not limited thereto.

The carrier gas and the vaporized precursors flowing along the pipeline (60) via the bubblers (30, 31) are sprayed through the shower heads (53) of the reactor (50), and at this time, the RF power supply (40) activates the reactant gases sprayed through the shower heads (53) by being connected to the susceptor (51). The activated precursors, after being sprayed through the shower heads (53) of the reactor (50), are deposited on the substrate (1) placed on the susceptor (51) to become a thin film. The gases remaining after the completion of the deposition reaction are exhausted to the outside via the exhaust system provided under the reactor.

At this time, the pressure of the carrier gas of the reactor (50) is preferably 0.1 torr to 100 torr so that the conditions for forming the thin film are optimized, and the temperature of the substrate (1) is preferably 20° C. to 200° C. If the temperature of the substrate (1) falls outside of the above range, the deposition rate decreases. The temperature of the substrate (1) is controlled using a heater embedded in the susceptor. In addition, the power supplied to the RF generator (40) ranges from 10 W to 500 W. If the power is above or below the above range, there may be a problem in that the formation of a low dielectric thin film having desired properties is difficult. The plasma frequency generated from the above ranges from 10 MHz to 100 MHz. The pressure of the carrier gas, the temperature of the substrate (1), and the supplying power described above are set to form the plasma having an optimal range capable of converting the precursor into reactive states and depositing the precursor-derivatives on the substrate (1), and the range may be appropriately adjusted by those skilled in the art depending on the types of the precursor. When tetrakis(trimethylsilyloxy)silane (precursor) and cyclohexane (additional precursor) are used as the precursors according to one example of the present invention, it is preferable that the plasma frequency be adjusted to be approximately 13.56 MHz.

FIG. 2 schematizes an RTA apparatus used for conducting an annealing process.

The RTA apparatus is used to perform heat treatment for a specimen, activate electrons in a semiconductor device process, change the interface between a thin film and a thin film, or between a wafer and a thin film, and increase the density of the thin film. In addition, this apparatus is also used to convert the state of the grown thin film, and decrease the loss due to an ion implantation. This RTA is conducted by heated halogen lamps and hot chucks. RTA has a short process duration time, which is different from a furnace, and thereby is called rapid thermal process (RTP) as well. Using this heat treatment apparatus, the thin film that is plasma deposited in the prior step can be annealed.

The inside of the RTA apparatus is surrounded by a plurality of halogen lamps, and the lamps generate heat while emitting orange light. This RTA apparatus may anneal the thin film that is plasma deposited in the prior step and the substrate on which the thin film is placed at 300° C. to 600° C. If the annealing temperature is lower than 300° C., there may be a problem in that the properties of the initially deposited thin film are not changed, and if the annealing temperature is higher than 600° C., the structure of the thin film may be undesirably converted from the hydrocarbon-rich thin film into a $SiO_x$-rich thin film. It is more preferable to rapidly increase the initial temperature to the temperature specified above within 5 minutes, and conduct the annealing for 1 minute to 5 minutes, such that the structure of the thin film can be effectively changed. The RTA annealing may be conducted under a pressure of 0.1 torr to 100 torr using nitrogen gas.

A third aspect of the present invention provides a semiconductor device with an insulating layer consisting of the porous film of the first aspect.

The porous film of the present invention has a low dielectric constant, and can thereby improve the resistance-capacitance (RC) delay time of the semiconductor device.

Advantageous Effects

Depositing a porous film using a cross-shaped precursor according to the present invention can provide a plasma polymerized porous film having significantly improved mechanical strength, and is effective in reducing complicated processes relating to pre- and post-treatments occurring in a spin casting method. In addition, the dielectric constant and the mechanical strength of the plasma polymerized porous film can be improved by controlling plasma polymerization conditions or having pores introduced by annealing the thin film that is deposited with the precursor.

Mode for Disclosure

Hereinafter, a plasma deposited polymer thin film according to the present invention and a thin film obtained by annealing the plasma deposited polymer thin film are described with reference to examples of the present invention. However, these examples are for illustrative purposes only, and the scope of the present invention is not limited thereto.

EXAMPLE 1

Manufacture of TTMSS:CHex Polymer Thin Film

Figure 1:
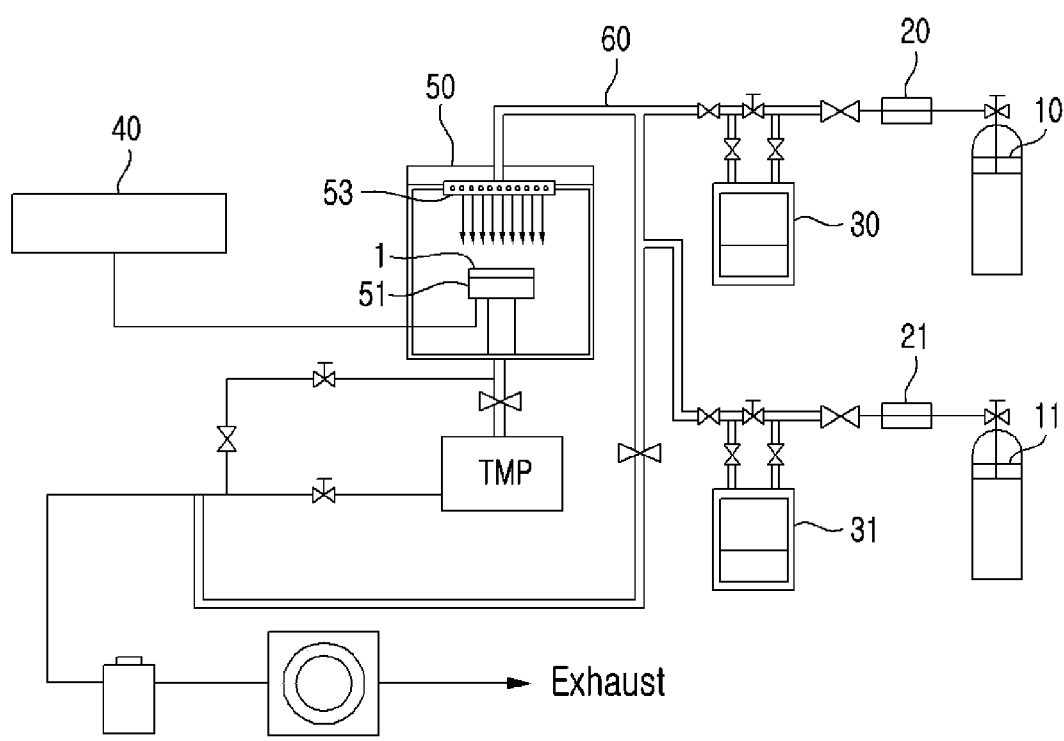
FIG. 1 is a schematic view of a plasma enhanced chemical vapor deposition (PECVD) apparatus used for manufacturing a plasma polymerized thin film according to one example of the present invention.

Using a PECVD apparatus shown by a diagram in FIG. 1, in first and second bubblers (30, 31), tetrakis(trimethylsilyloxy)silane (hereinafter referred to as 'TTMSS') was placed as a precursor, and cyclohexane (hereinafter referred to as 'CHex') was placed as an additional precursor, respectively, and the bubblers were heated to 90° C. and 55° C., respectively, vaporizing the precursor solutions. Using helium (He)

gas having ultra-high purity of 99.999% as a carrier gas, the vaporized precursors were sprayed through the shower heads (53) of the reactor for plasma deposition (50) and then plasma deposited on the substrate (1). The pressure of the reactor (50) at the time was $6.6 \times 10^{-1}$ torr, and the temperature of the substrate was 35° C. In addition, the power supplied to the RF generator was applied changing from 10 W to 50 W, and the resulting plasma frequency was approximately 13.56 MHz.

The plasma polymerized thin film deposited as above was referred to as 'TTMSS:CHex'. The thickness of the TTMSS: CHex polymer thin film was measured to be 0.4 μm to 0.55 μm. The assumed deposition mechanism is as follows. That is, the monomers of the precursor mixture transferred into the reactor (50) were activated to reactive species or decomposed by plasma and then condensed on the substrate (1).

Figure 2:
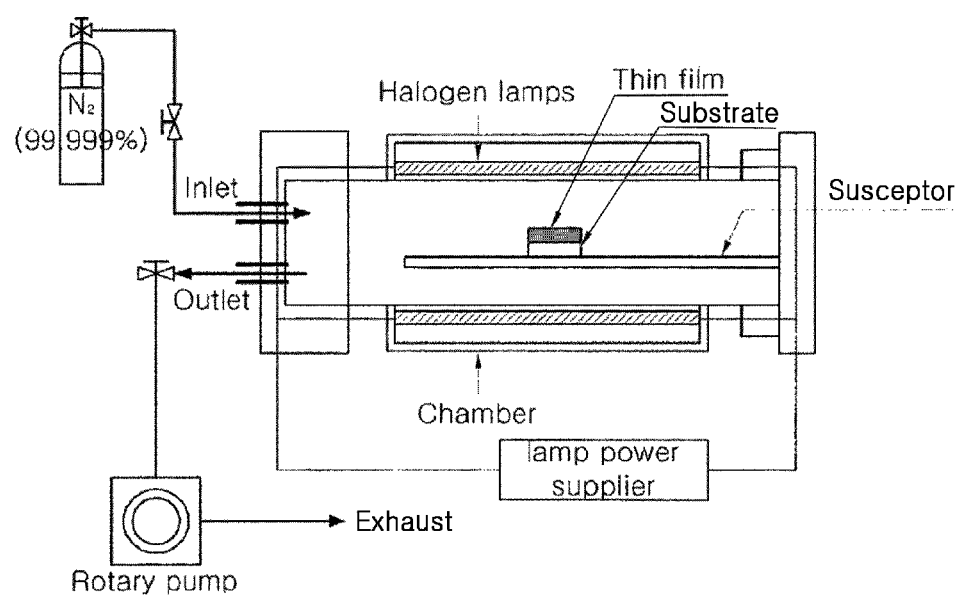
FIG. 2 is a schematic view of a Rapid Thermal Annealing (RTA) apparatus used for manufacturing a plasma polymerized thin film according to one example of the present invention.

The plasma polymerized thin film TTMSS:Chex obtained as above was annealed using an RTA apparatus shown by a diagram in FIG. 2. The TTMSS:CHex deposited on the substrate was placed in an RTA system, and heat was generated using 12 halogen lamps disposed therearound, and the TTMSS:CHex thin film was heat treated to 500° C. for 5 minutes under nitrogen atmosphere. The pressure of the nitrogen gas was set to 1.0 torr.

The effects of RTA on this plasma polymerized TTMSS: CHex thin film were verified through the following experiments. In the accompanying drawings, an 'as-deposited thin film' and a '500° C. annealed thin film' are defined as follows.

As-deposited thin film: initial TTMSS:CHex thin film that was plasma deposited according to the first step of the present invention 500° C. annealed thin film: film obtained by RTA annealing the initial plasma deposited TTMSS:CHex thin film using nitrogen gas

EXAMPLE 2

Manufacture of TTMSS Polymer Thin Film (ppTTMSS)

Using a PECVD apparatus, TTMSS was placed in a bubbler as a precursor, and the bubbler was heated to 90° C., vaporizing the precursor solution. Using helium (He) gas having ultra-high purity of 99.999% as a carrier gas, the vaporized precursor was sprayed through the shower heads of the reactor for plasma deposition and then plasma deposited on the substrate. The plasma polymer films were deposited on highly boron-doped $P^{++}$ (<0.005 ohm*cm) silicon (metallic-silicon) and n-type (2.0 ohm*cm to 10.0 ohm*cm) silicon substrates. The Si substrates were cleaned in trichloroethylene, acetone, and methanol prior to the deposition process.

The plasma power supplied by the radio frequency (RF) generator was changed from 10 W to 100 W, and the deposition was performed with the reactor pressure of 500 mTorr, 1000 mTorr, and 1500 mTorr at room temperature. The plasma polymerized thin film deposited as above was referred to as 'ppTTMSS'.

TABLE 1

| | |
|---|---|
| Substrate | Si wafer (100) |
| SiCOH source | Tetrakis(trimethylsilyloxy)silane |
| Base pressure | 20 mTorr |
| Process pressure | 500/1000/1500 mTorr |
| Deposition Power | SB 10/20/30/50/100 W |

EXPERIMENTAL EXAMPLE 1

Figure 3:
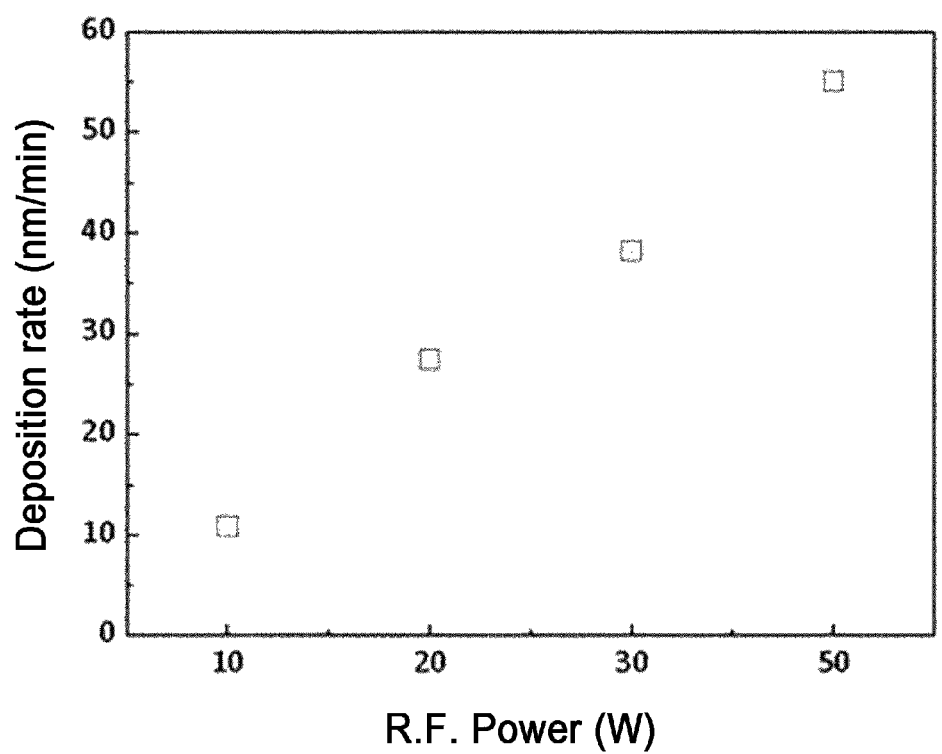
FIG. 3 is a graph showing the deposition rate of a plasma polymerized thin film manufactured according to one example of the present invention.

FIG. 3 is a graph showing the deposition rate for the TTMSS:CHex thin film when the TTMSS:CHex thin film was deposited using the PECVD apparatus according to Example 1. According to FIG. 3, it was verified that the deposition rate of the thin film increased as the power supplied to the RF generator (40) gradually increased.

EXPERIMENTAL EXAMPLE 2

Relative dielectric constants for the plasma deposited TTMSS:Chex thin film and the annealed TTMSS:CHex thin film according to Example 1 were measured.

The dielectric constant was measured by applying signals having a frequency of 1 MHz to a capacitor having an Al/TTMSS:CHex/metallic-Si structure provided on a silicon substrate (metallic-Si) having very low resistance. The result is shown in FIG. 4.

Figure 4:
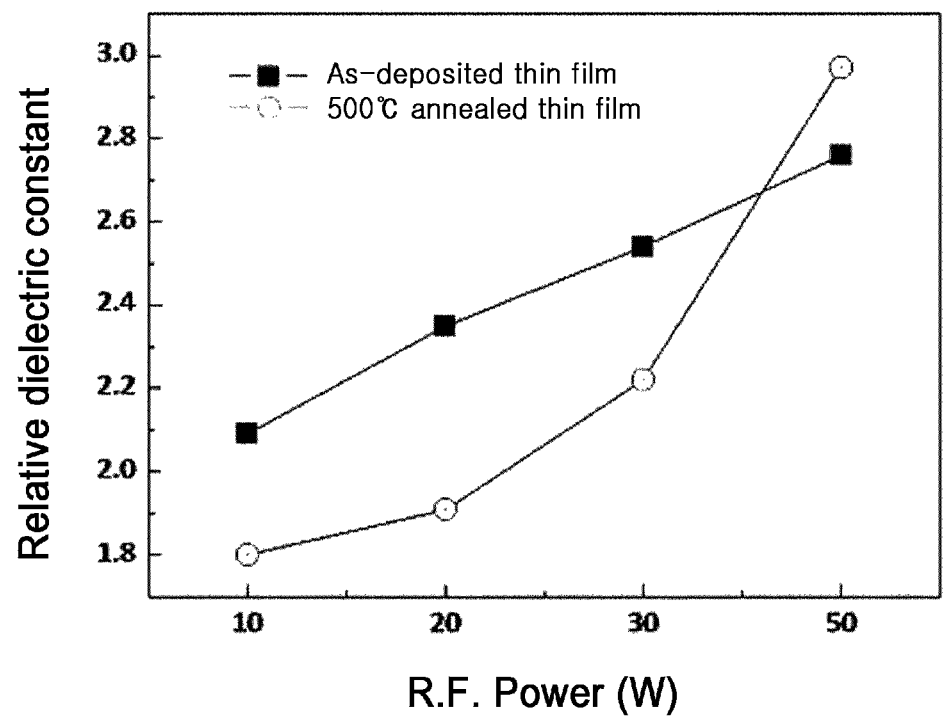
FIG. 4 is a graph showing the relative dielectric constant (k) of a plasma polymerized thin film manufactured according to one example of the present invention.

According to FIG. 4, the relative dielectric constant (k) increased from 2.09 to 2.76 as the power for the plasma deposited TTMSS:CHex thin film increased, and the relative dielectric constant of the annealed TTMSS:CHex thin film increased from 1.80 to 2.97. As a result, it was seen that the relative dielectric constant generally decreased when the plasma deposited TTMSS:CHex thin film was RTA annealed.

EXPERIMENTAL EXAMPLE 3

Figure 5:
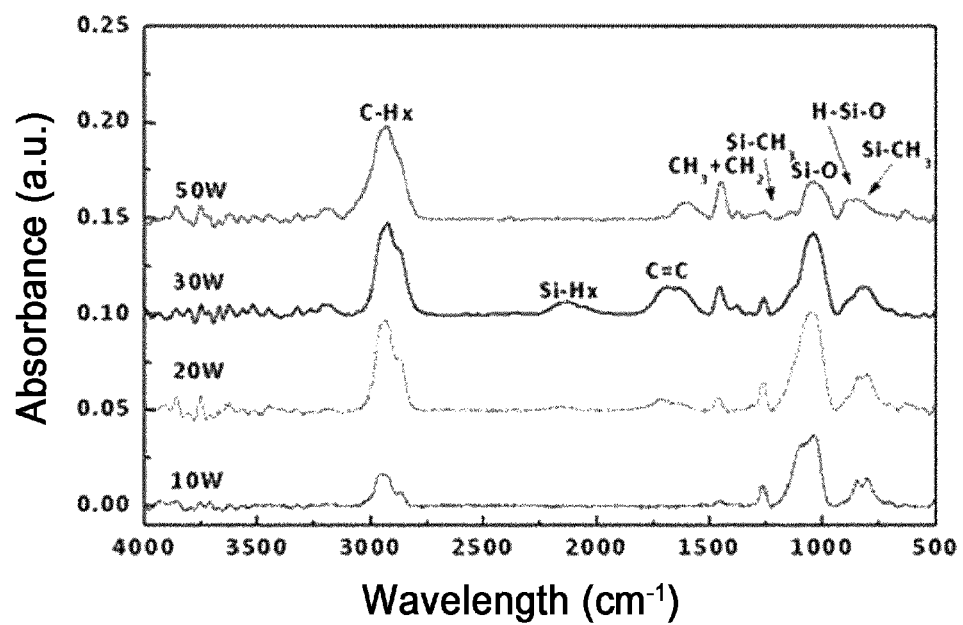
FIG. 5 is a graph showing the chemical structure for a plasma polymerized thin film manufactured according to one example of the present invention prior to annealing, obtained by Fourier transform infrared spectroscopy.
Figure 6:
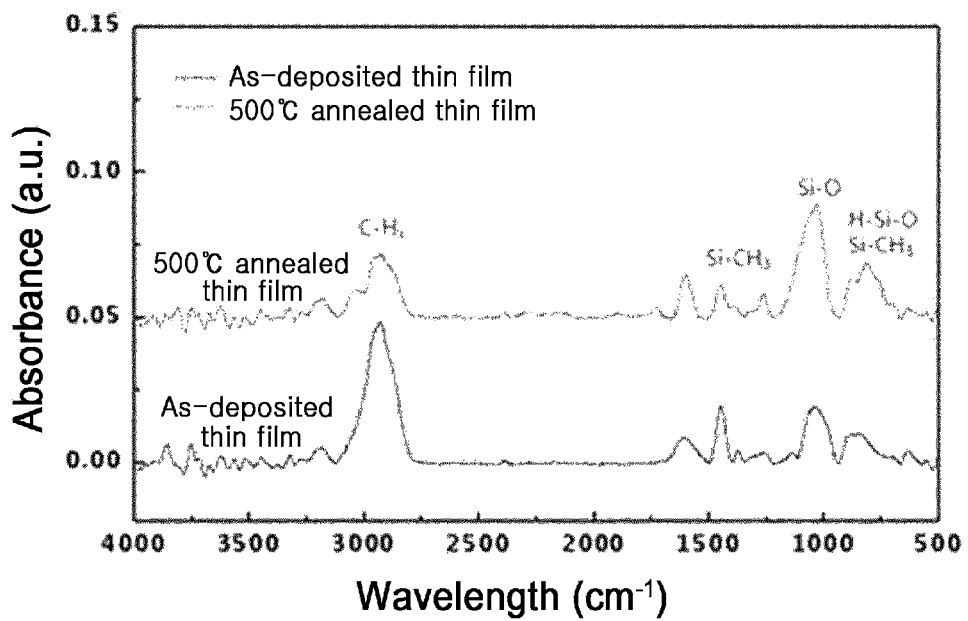
FIG. 6 is a graph showing the chemical structure for a plasma polymerized thin film manufactured according to one example of the present invention after annealing, obtained by Fourier transform infrared spectroscopy.

For the plasma deposited TTMSS:CHex thin film and the annealed TTMSS:CHex thin film according to Example 1, the chemical structures thereof obtained by Fourier transform infrared spectroscopy were identified, and the results are shown in FIG. 5 and FIG. 6.

Figure 7:
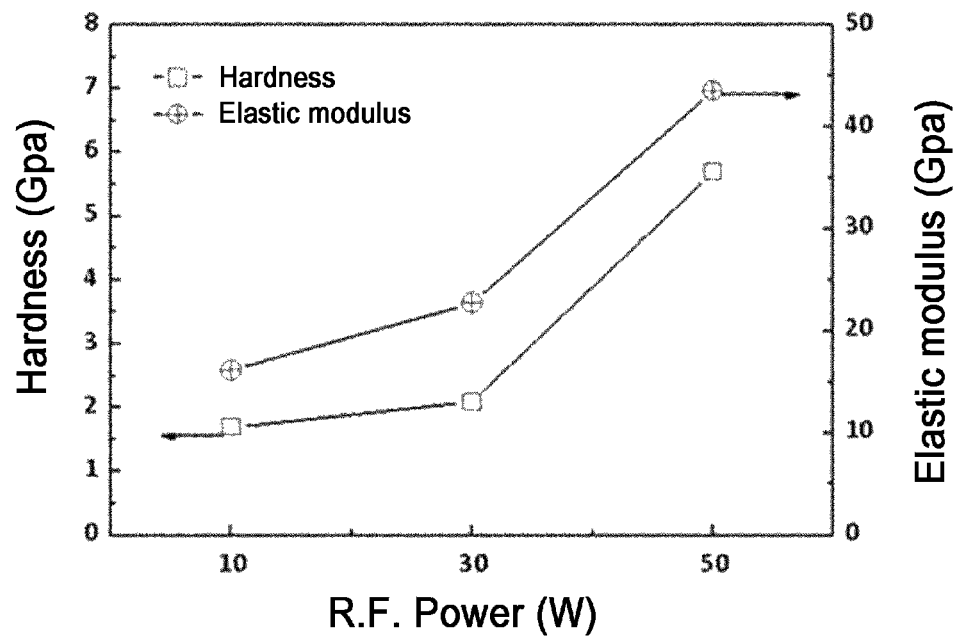
FIG. 7 is a graph showing the hardness and the elastic modulus of a plasma polymerized thin film manufactured according to one example of the present invention prior to annealing.

First, FIG. 5 is a graph showing the chemical structure of the plasma deposited TTMSS:CHex thin film deposited with various applying powers. As shown in the graph, it can be seen that, in the plasma deposited TTMSS:CHex thin film, C-Hx bonding structures (hydrocarbon) and Si—O bonding structures basically have the majority. In particular, it was seen that as the power increased, the amounts of the hydrocarbon increased since the C-Hx bonding structure increased. As shown in FIG. 7 seen later, it is considered that the hardness and the elastic modulus of the thin film would be able to increase as the amounts of the hydrocarbon increased.

Figure 8:
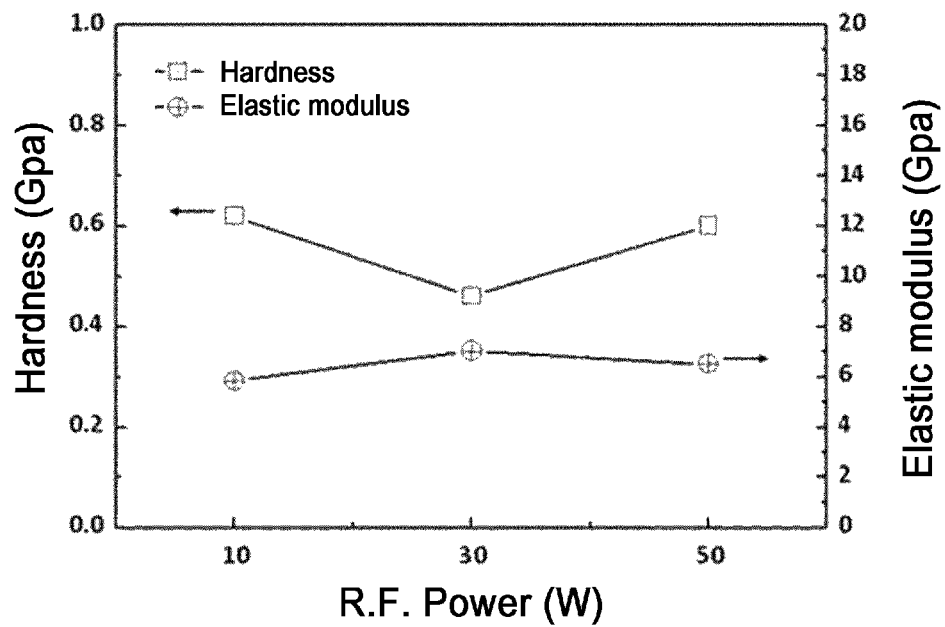
FIG. 8 is a graph showing the hardness and the elastic modulus of a plasma polymerized thin film manufactured according to one example of the present invention after annealing.
Figure 9:
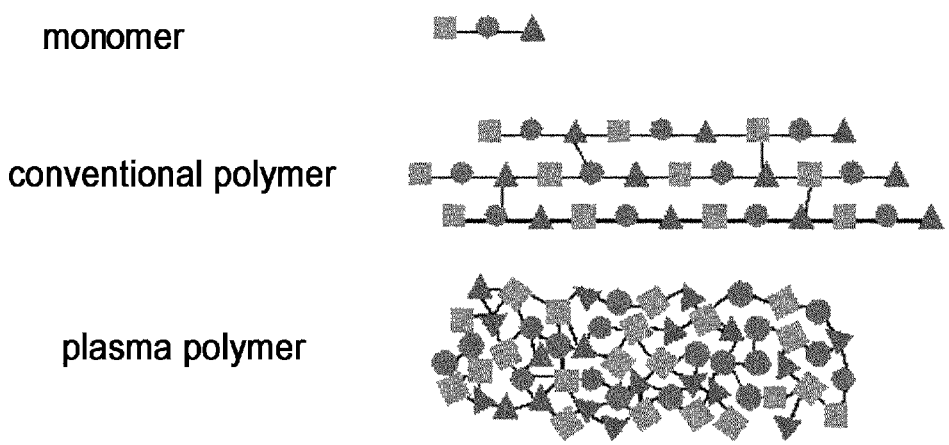
FIG. 9 is a summary diagram comparing polymers in a polymerization reaction using the plasma of the present invention and a general polymerization reaction.

In FIG. 6, it was shown that, in both the plasma deposited TTMSS:CHex thin film and the annealed TTMSS:CHex thin film, stretching vibrations for the respective chemical structures are generated at the same positions over the entire wavenumber range. This shows that the plasma deposited TTMSS: CHex thin film and the annealed TTMSS:CHex thin film both have similar bonding structures. However, specifically, it was seen that the annealed thin film had a relatively higher Si—O bonding structure compared to a C-Hx bonding structure. As shown in FIG. 8 seen later, it was verified that the dielectric constant generally decreased and the hardness of the thin film was also reduced after annealing, and it is considered that the hardness of the thin film was more or less reduced by the pores being formed where the hydrocarbon was sublimated, as the hydrocarbon was sublimated due to the heat treatment. However, in tetrakis(trimethylsilyloxy)silane, which is one of the precursors of the thin film, the structure of the precursor molecule is expected to have a cross shape in which a Si atom at the center is linked to oxygen atoms in four directions, and the bonding around Si is considered to be solidly maintained due to this structural stability. Therefore, it is considered that maintaining the bonding around Si even after annealing at a high temperature prevents the hardness and the elastic modulus of the thin film from being seriously reduced.

EXPERIMENTAL EXAMPLE 4

The hardness and the elastic modulus for the plasma deposited TTMSS:CHex thin film according to Example 1 were measured.

For the plasma deposited TTMSS:CHex thin film, the hardness of the thin film was measured using a nano-indenter, and furthermore, the elastic modulus of the thin film was also measured using a nano-indenter. The results are shown in FIG. 7.

According to FIG. 7, it was seen that the hardness of the plasma deposited TTMSS:CHex thin film increased from 1.6 GPa to 5.6 GPa as the applying power increased, and the elastic modulus also greatly increased from 16 GPa to 44 GPa. Particularly, it is considered to be due to the increase of the C-Hx bonding structure within the thin film with the increase of power, as described in Experimental Example 3.

EXPERIMENTAL EXAMPLE 5

The hardness and the elastic modulus for the annealed TTMSS:CHex thin film according to Example 1 were measured.

For the annealed TTMSS:CHex thin film, the hardness of the thin film was measured using a nano-indentor, as in Experimental Example 4, and furthermore, the elastic modulus of the thin film was measured. The results are shown in FIG. 8.

According to FIG. 8, the hardness of the annealed TTMSS:CHex thin film was reduced and then increased again as the applying power increased, and it was seen that the value was maintained between 0.45 GPa and 0.6 GPa. For the elastic modulus, it was seen that the value was maintained between 6 GPa and 7 GPa.

The hardness and the elastic modulus for the annealed TTMSS:CHex thin film were reduced compared to those for the plasma deposited TTMSS:CHex thin film examined in Experimental Example 4, and as described in Experimental Example 3, it is considered to be the result of C-Hx bonding structure reduction within the thin film due to the sublimation of the hydrocarbon from annealing. However, although the hardness and the elastic modulus were reduced after annealing, the thin film of the present invention sill had mechanical properties sufficient for use in a semiconductor process. It was verified that the thin film provided in the present invention was an excellent thin film having a low dielectric constant and also having high mechanical strength by the bonding around Si being solidly maintained even after annealing due to the structural characteristics of tetrakis(trimethylsilyloxy)silane (TTMSS). The thin film provided in the present invention was shown to have excellent mechanical strength when compared with existing thin films having relative dielectric constants (k=1.8 to 2.5) and hardness after annealing (0.12 GPa to 0.57 GPa), which are provided in a literature published by K. Maex research group (K. Maex, M. R. Baklanov, D. Shamiryan, F. Iacopi, S. H. Brongersma, and Z. S. Yanovitskaya J. Appl. Phys, 93 (2003) 8793).

EXPERIMENTAL EXAMPLE 6

The chemical compositions of ppTTMSS films were described with various plasma powers and deposition pressures by FT-IR spectra in the wavenumber range from 4000 $cm^{-1}$ to 500 $cm^{-1}$. These spectra were normalized to the same thickness. In addition, the area ratios of various peaks of ppTTMSS films were represented and summarized in the figures and tables, respectively.

Figure 10:
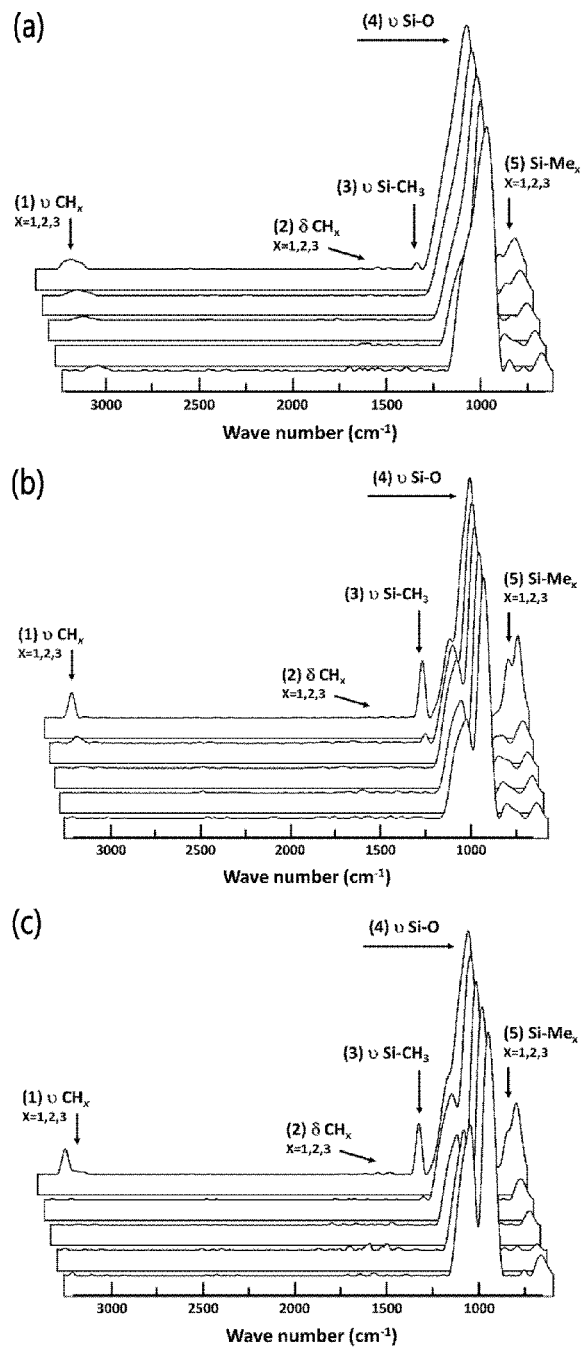
FIG. 10 is a graph showing the chemical structure for porous films prepared according to Example 2 of the present invention (ppTTMSS), obtained by Fourier transform infrared spectroscopy. Each of (a), (b), and (c) represents an FT-IR spectrum measured for the film prepared in a reactor with pressure of 500 mTorr, 1000 mTorr, and 1500 mTorr, respectively.

Those at approximately 3200 $cm^{-1}$ to 2800 $cm^{-1}$ are from $CH_x$ (x=2, 3) stretching vibrations. The peaks at approximately 1500 $cm^{-1}$ to 1350 $cm^{-1}$ are due to $CH_x$ (x=2, 3) related bending vibration modes, and around 1240 $cm^{-1}$ to 1300 $cm^{-1}$ corresponds to the Si—$CH_3$ bending mode. The peaks at around 1240 $cm^{-1}$ to 950 $cm^{-1}$ are from the Si—O related stretching vibration modes. The broad absorption band between 950 $cm^{-1}$ and 650 $cm^{-1}$ corresponds to H—Si—O and Si-$Me_x$ (x=1, 2, 3) bending vibration. These peaks were observed in all the deposition conditions as shown in FIG. 10.

In the case of deposition pressure of 500 mtorr (referred to as D (500)), the area ratios of peaks associated with hydrocarbons, such as $CH_x$ stretching ($\upsilon$)/bending ($\delta$), Si—$CH_3$ and Si-$Me_x$ (x=1, 2, 3) bending ($\delta$) modes, were decreased with increasing plasma powers, while the area ratios of Si—O related stretching ($\upsilon$) vibration modes (referred to as Area (SiO)) were increased (Table 2).

TABLE 2

| | $\upsilon CH_x$ x = 1, 2, 3 | $\delta CH_x$ x = 1, 2, 3 | $\delta$Si—$CH_3$ | $\upsilon$Si—O | $\delta$Si—$Me_x$ x = 1, 2, 3 |
|---|---|---|---|---|---|
| Area ratio of peaks (%) | 2.61 | 0.09 | 0.50 | 78.07 | 7.83 |
| | 2.11 | 0.08 | 0.27 | 91.98 | 5.64 |
| | 1.49 | 0.08 | 0.14 | 94.11 | 4.26 |
| | 0.17 | 0.09 | 0.10 | 95.74 | 3.99 |
| | 0.07 | 0.07 | 0.07 | 95.93 | 3.93 |

For the deposition pressures of 1000 mtorr and 1500 mtorr (referred to as D (1000) and D (1500), respectively), the FT-IR spectra of ppTTMSS films were represented in FIG. 10. A similar tendency for the changing of area ratios was observed. However, the area ratios of peaks related to hydrocarbons of ppTTMSS films deposited by a plasma power of 10 W were higher than D (500) (Tables 3 and 4).

TABLE 3

| | $\upsilon CH_x$ x = 1, 2, 3 | $\delta CH_x$ x = 1, 2, 3 | $\upsilon$Si—$CH_3$ | $\upsilon$Si—O | $\upsilon$Si—$Me_x$ x = 1, 2, 3 |
|---|---|---|---|---|---|
| Area ratio of peaks (%) | 2.57 | 0.09 | 5.64 | 72.00 | 19.79 |
| | 1.80 | 0.08 | 0.99 | 90.05 | 8.53 |
| | 0.44 | 0.08 | 1.00 | 90.49 | 6.71 |
| | 0.30 | 0.09 | 0.08 | 92.72 | 6.90 |
| | 0.60 | 0.07 | 0.25 | 92.86 | 6.30 |

TABLE 4

| | $\upsilon CH_x$ x = 1, 2, 3 | $\delta CH_x$ x = 1, 2, 3 | $\upsilon$Si—$CH_3$ | $\upsilon$Si—O | $\upsilon$Si—$Me_x$ x = 1, 2, 3 |
|---|---|---|---|---|---|
| Area ratio of peaks (%) | 4.59 | 0.07 | 4.05 | 74.69 | 16.67 |
| | 0.65 | 0.08 | 0.27 | 94.16 | 4.92 |
| | 0.66 | 0.08 | 0.12 | 95.61 | 3.61 |
| | 0.62 | 0.07 | 0.13 | 95.81 | 2.62 |
| | 0.65 | 0.07 | 0.16 | 97.35 | 1.84 |

EXPERIMENTAL EXAMPLE 7

Figure 11:
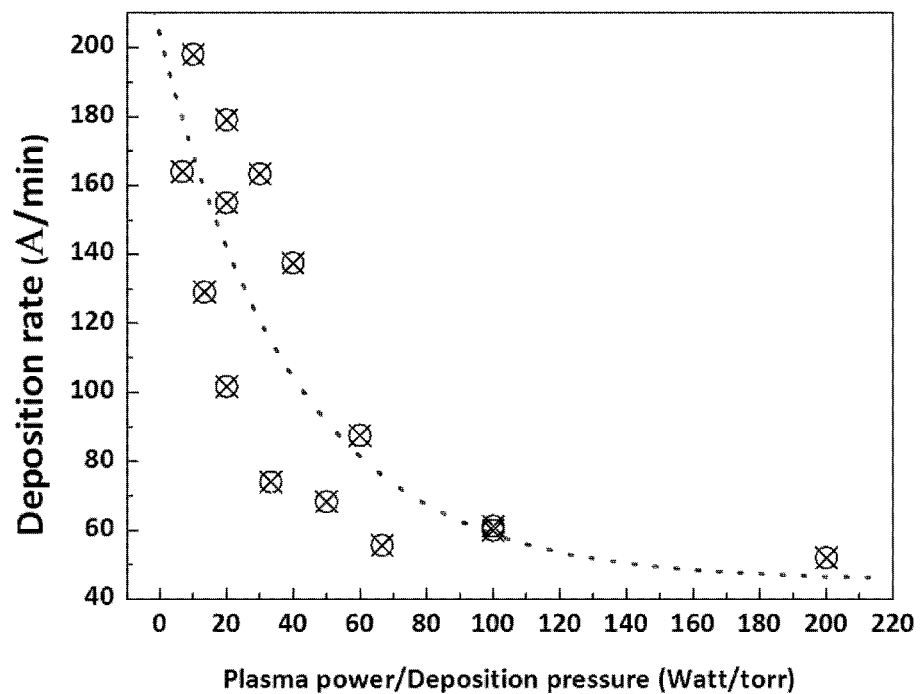
FIG. 11 is a graph showing the deposition rate of ppTTMSS as a function of P/D.

The deposition rates of ppTTMSS films were shown in FIG. 11 as a function of plasma power per deposition pressure (referred to as P/D; W/torr). The deposition rates of ppTTMSS films were significantly decreased at around 60 W/torr.

Thereafter, the changing of deposition rate was smoothly reduced. The relationship between deposition rate and P/D is exponential, as expressed in the following equation:

$$y = 157.8 \exp\left(-\frac{x}{40.6}\right) + 45.5$$

The tendency of deposition rates of ppTTMSS films can be explained by the state of plasma. In the plasma polymerization process, free radicals or atoms are produced by collision of energetic electrons or ions with molecules (i.e. precursor) in the gas phase. Then, the radicals or ions are adsorbed on the surface of the substrates or on the deposited film.

Therefore, when low plasma power (i.e. P/D of around 60 W/torr) was supplied to the precursor, large fragments (i.e. radical or activated species) were produced and adsorbed on the substrate having a relatively high deposition rate. However, small fragments decomposed by high plasma power (i.e. P/D) from a precursor would have a relatively low deposition rate.

Figure 12:
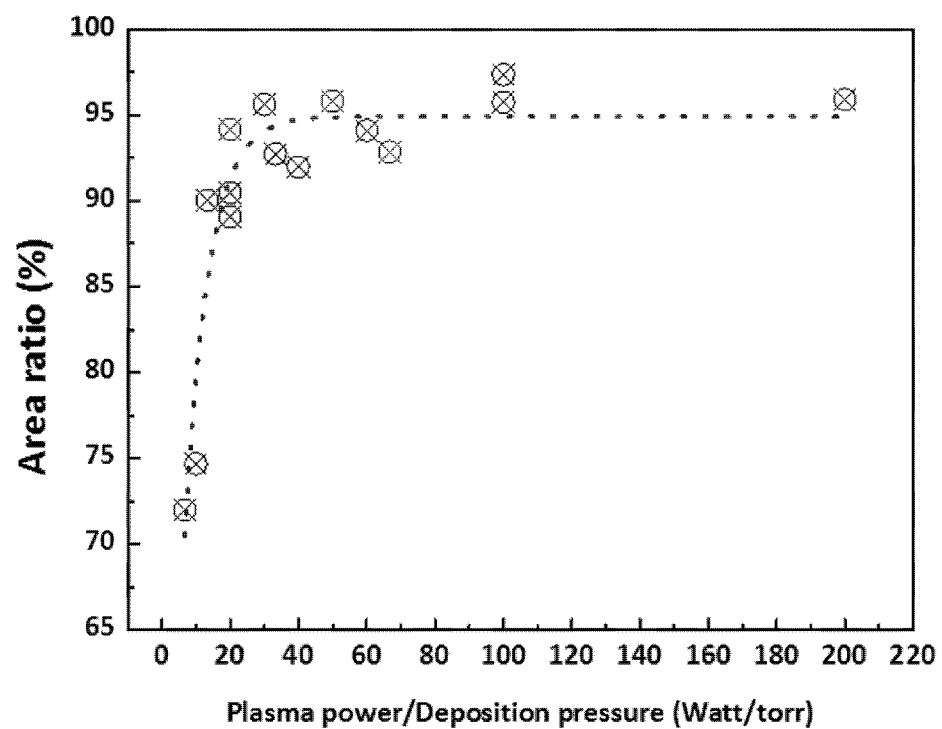
FIG. 12 is a graph showing the area (SiO) of ppTTMSS films with various P/D.

FIG. 12 represents the area ratio of Si—O stretching peaks, which is referred to as Area (SiO), with various P/D. The Area (SiO) of ppTTMSS films deposited by very low P/D (i.e. below 20 W/torr) was increased to around 85%. Thereafter, the changing of Area (SiO) was gradually increased.

The tendency of Area (SiO) of ppTTMSS films can be explained by the method for competition of ablation and polymerization (CAP). From the viewpoint of plasma polymerization as a material production process, there are two opposing processes: polymer formation, which leads to the deposition of materials, and ablation, which leads to the removal of materials, and the two processes compete.

Therefore, when very low plasma power (i.e. P/D of below 20 W/torr) was supplied to the precursor, the polymerization reaction took place (i.e. low ablation process) while maintaining the hydrocarbon portion of the precursor (that have relatively low Si and O portions). However, at high P/D (i.e. plasma power), the precursors were decomposed into small fragments (i.e. radical or activated species) having Si, O, and hydrocarbon portions. Then, the Si and O portions dominantly participated in the polymerization process. At the same time, the hydrocarbon portion caused the ablation process and/or low polymerization process.

Figure 13:
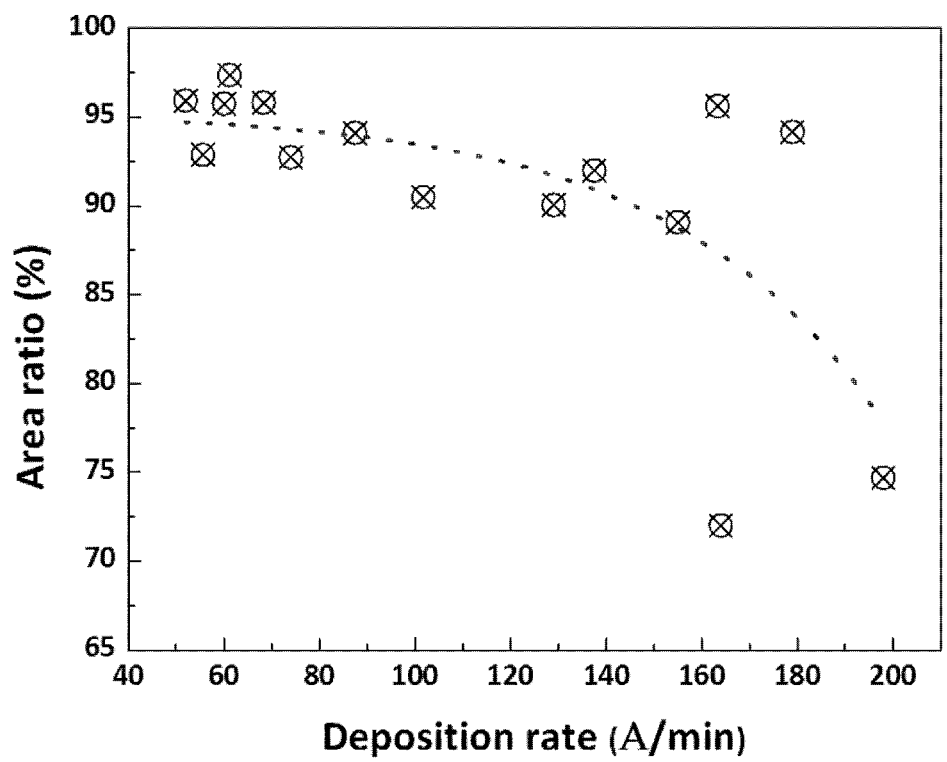
FIG. 13 is a graph showing the area (SiO) of ppTTMSS films as a function of deposition rate.

FIG. 13 depicts a plot between the Area (SiO) and deposition rate. The Area (SiO) of ppTTMSS films was smoothly decreased at a deposition rate of around 150 A/min. Thereafter, the Area (SiO) was significantly reduced. The relationship between Area (SiO) and deposition rate of ppTTMSS films can be explained by results of FIGS. 11 and 12. In the previous work, the changing of deposition rate and the changing of Area (SiO) as a function of D/P were represented by the state of plasma and the method for CAP, respectively.

Therefore, at the low deposition rate (i.e. below around 150 A/min), the small (or medium) fragments having Si and O composition lead to low deposition (polymerization process), while the relatively large fragments having hydrocarbons cause a high deposition rate of ppTTMSS films.

Figure 14:
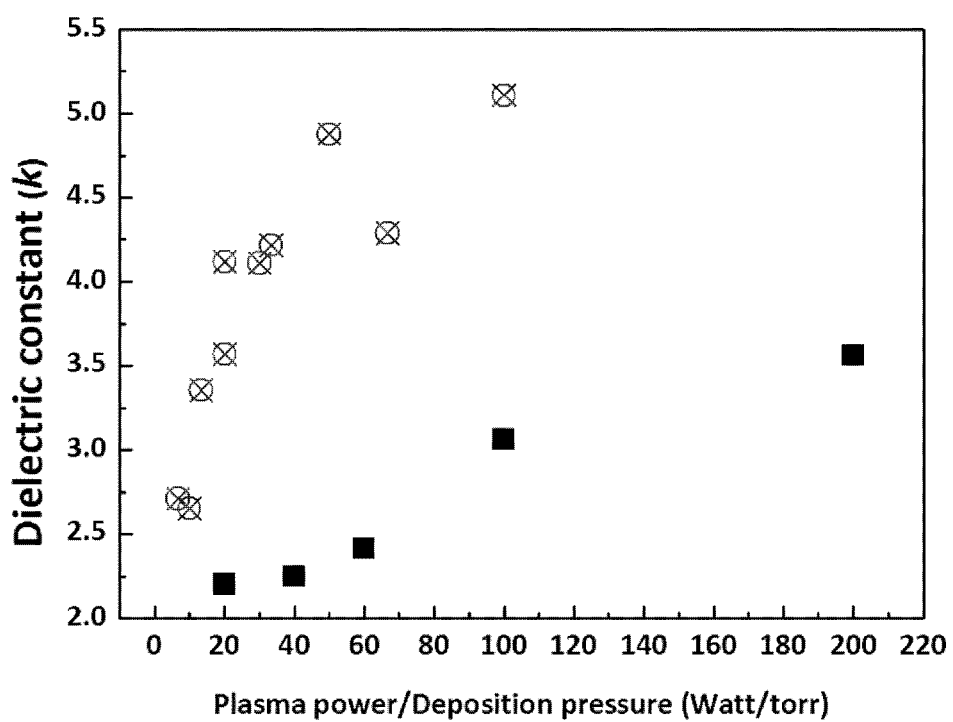
FIG. 14 is a graph showing the dielectric constants of ppTTMSS films with increasing in P/D.
Figure 15:
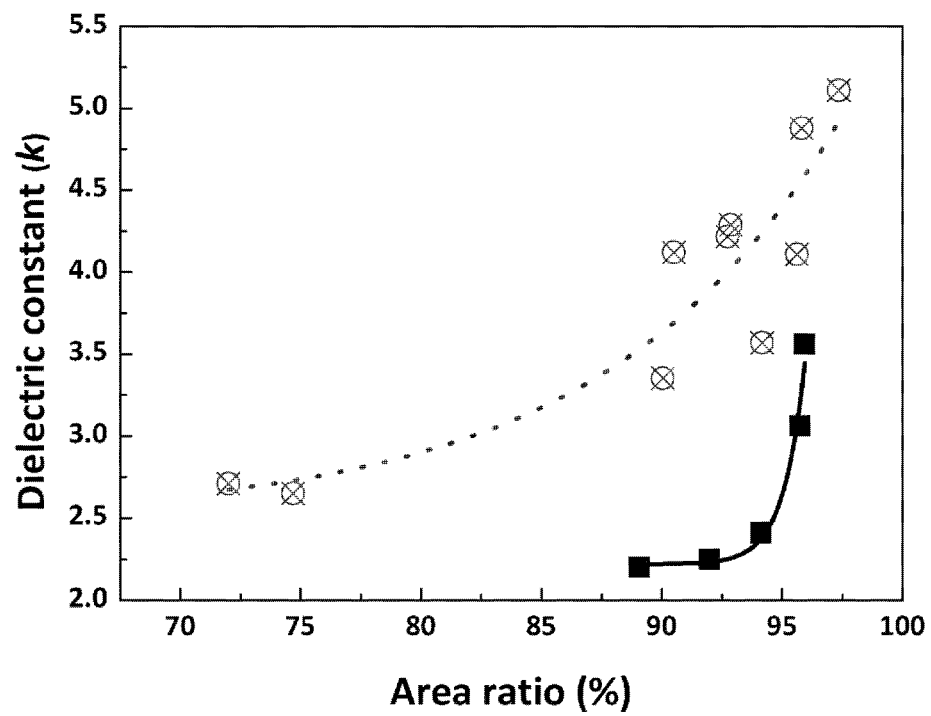
FIG. 15 is a graph showing the dielectric constants of ppTTMSS films as a function of area (SiO).

The dielectric constants of the ppTTMSS films were shown in FIG. 14. When the dielectric constants are plotted with D/P, there are two regions having low and ultra-low dielectric constants referred to as low-k (LK) and ultra low-k (ULK). In the LK region (⊗ symbol), the dielectric constants of ppTTMSS films were increased from 2.65 to 5.32, and the dielectric constants of the ULK region (■ symbol) range from 2.1 to 3.56.

In detail, to obtain the ultra-low dielectric constant films, the porogen loading process and treatment on the SiCOH films have been reported. The first step is a copolymerization of two precursors to generate a hybrid material. This hybrid is an amorphous SiOCH matrix containing inclusions of an organic sacrificial fragment. The second step is a thermal treatment where the sacrificial fragments are removed to generate porosity. These hybrid films are deposited by PECVD, which corresponds to one of the favorite deposition techniques in the semiconductor industry. However, in the present invention, the ultra-low dielectric constant films were successfully fabricated without the porogen loading process and thermal treatment due to the chemical composition and structure of TTMSS. It has a structure of a cross shape, in which a Si atom at the center is linked to oxygen atoms in four directions. The four trimethylsilyl ($Si(CH_3)_3$) groups are bonded to four oxygen atoms. It is thought that these compositions and structures of TTMSS with four branches would enhance the cross-linking. Finally, in the ultra-low dielectric films consisted of the cage structure, which increased the porosity.

On the other hand, the silicon dioxide ($SiO_2$) films have a dielectric constant (k) of 4. In order to obtain the films with a lower dielectric constant, the polarizability of molecules in the films needs to be lowered. It can be achieved by inserting atomic groups with a small polarizability and/or by lowering the electronic density. Therefore, in the case of the LK region, it is observed that the amount of the hydrocarbon is higher than in the ULK region, and the hydrocarbon having a small polarizability as compared with Si and O contributed to the low dielectric constants.

EXPERIMENTAL EXAMPLE 8

Figure 16:
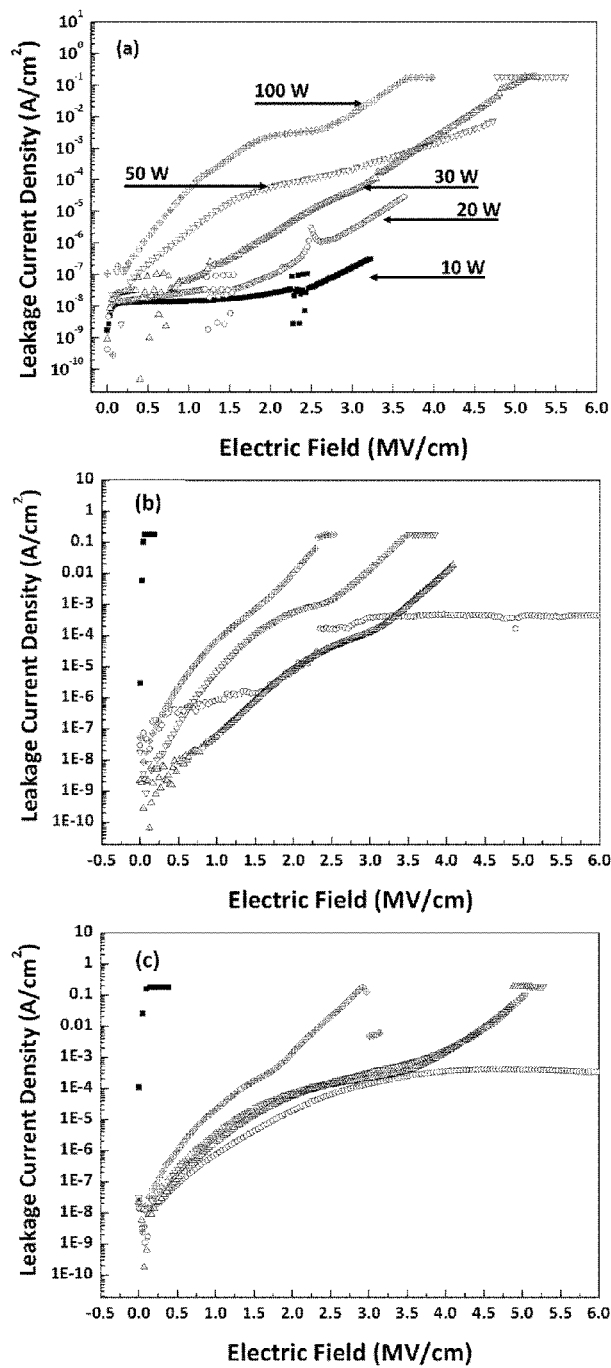
FIG. 16 is a graph showing the current-voltage curves of ppTTMSS films prepared in a reactor with pressure of (a) 500 mTorr, (b) 1000 mTorr, and (c) 1500 mTorr.

The current density-electric field curves of ppTTMSS films were shown in FIG. 16. The leakage current densities of ppTTMSS films of D (500) were high with increasing plasma power. For D (1000) and D (1500), the breakdown-phenomenon immediately occurred when the voltage was applied on the film. Thereafter, the tendency of leakage current density was similar to that of D (500) films.

Figure 17:
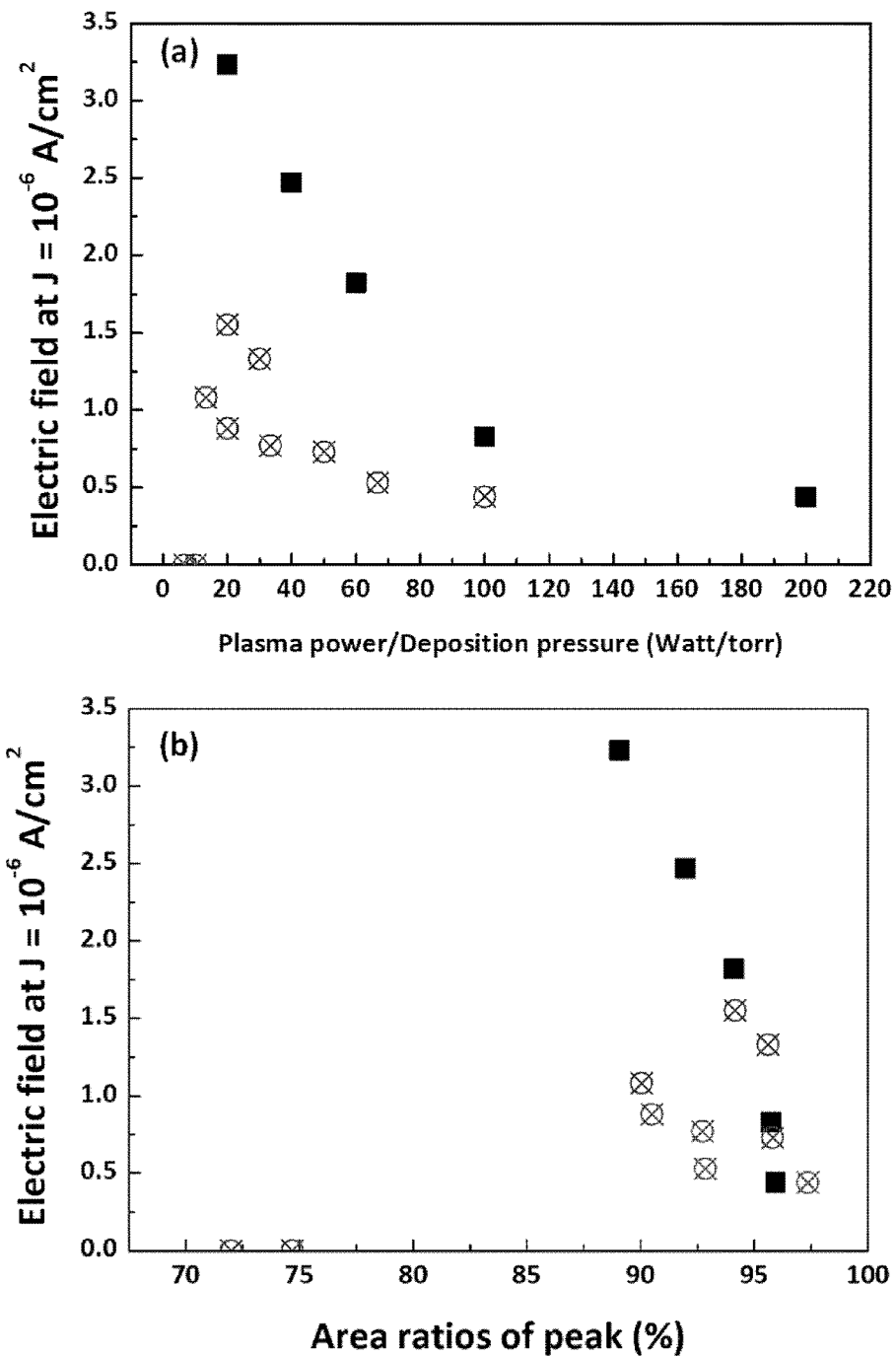
FIG. 17 is a graph showing the electric field of ppTTMSS at the leakage current density of $10^{-6}$ $A/cm^2$ ($E_{ins}$) with various (a) P/D and (b) Area (SiO).

In order to investigate the details of the I-V characteristics, the electric field across the ppTTMSS films, where the leakage current density was $10^{-6}$ A/cm$^2$, (referred to as $E_{ins}$) was plotted with D/P and Area (SiO) of ppTTMSS films in FIG. 17. The $E_{ins}$ value could replace the leakage current density in the present invention (i.e. high $E_{ins}$ value means low current leakage). The $E_{ins}$ values of D (500) films were significantly decreased (leakage current density was increasing) with increasing D/P, and were higher than those of D (1000) and D (1500) films (i.e. the leakage current density of D (500) films was lower than those of D (1000) and D (1500) films). In addition, when the Area (SiO) was increased, overall, the $E_{ins}$ values were decreased. It is thought that the high Area (SiO) in the ppTTMSS films induced the increase of leakage current density.

EXPERIMENTAL EXAMPLE 9

Figure 18:
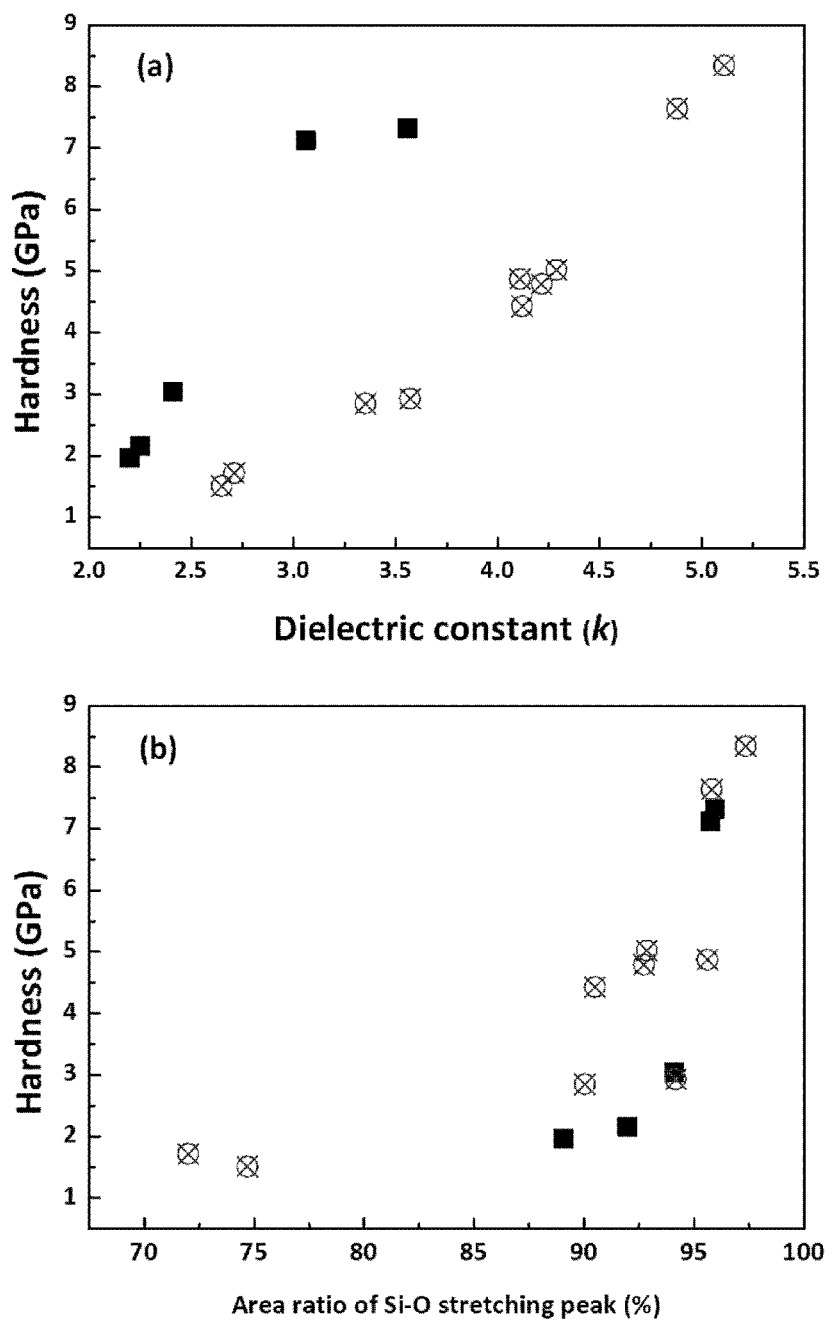
FIG. 18 is a graph showing the hardness of ppTTMSS films with various (a) dielectric constants and (b) area (SiO).
Figure 19:
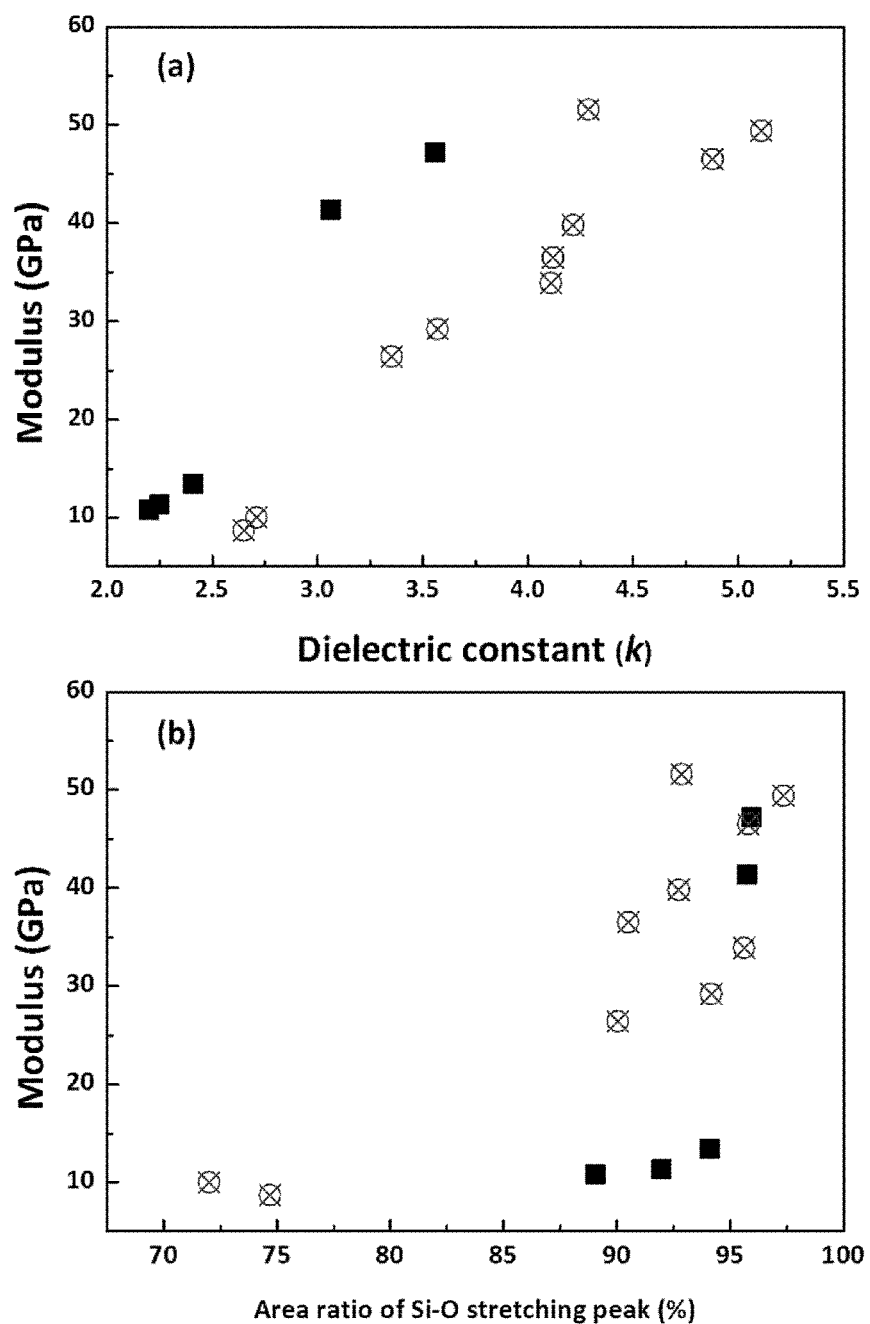
FIG. 19 is a graph showing the modulus of ppTTMSS films with various (a) dielectric constants and (b) area (SiO).

FIGS. 18 and 19 indicated the hardness and modulus of ppTTMSS films as a function of dielectric constant. In the material processing of low dielectric constant SiCOH films, the issue is the trade-off between dielectric constant and mechanical strength (i.e. hardness and modulus) of low dielectric constant SiCOH films. In the present invention, the hardness and modulus were increased with increasing dielectric constant. Although the ppTTMSS films of the ULK region have a porous structure, the relatively high Si—O portion would guarantee the hardness and modulus like those of the LK region. The mechanical properties of ppTTMSS films having a dielectric constant of 3.0 were reasonably increased with increasing Area (SiO).

| Reference | |
|---|---|
| 1: Substrate | 10, 11: Carrier Gas Storage Unit |
| 20, 21: Flow Rate Controller | |
| 30, 31: Bubbler | |
| 40: RF Generator | 50: Reactor |
| 51: Susceptor | 53: Shower Head |
| 60: Pipeline | |

The invention claimed is:

1. A porous film with high hardness and a low dielectric constant formed by plasma polymerization using a compound represented by the following Chemical Formula 1 as a precursor:

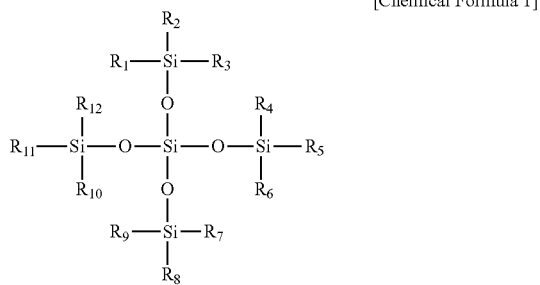

[Chemical Formula 1]

in the formula,
$R_1$ to $R_{12}$ are each independently H or $C_1$-$C_5$ alkyl,
wherein a relative dielectric constant of the porous film is controlled within the range from 1.5 to 3.5 by introducing pores and the hardness of the porous film is controlled within the range from 0.1 GPa to 10 GPa.

2. The porous film of claim 1, wherein the pores are formed by performing plasma polymerization in a reactor with a controlled process pressure under 750 mTorr.

3. The porous film of claim 1, wherein the pores are formed by annealing the film formed via plasma polymerization using the precursor with a hydrocarbon compound as an additional precursor.

4. The porous film of claim 3, wherein the additional precursor is a $C_6$-$C_{12}$ alkane, an alkene, a cycloalkane, a cycloalkene or a mixture thereof.

5. The porous film of claim 3, wherein the precursor and the additional precursor are provided as a type of solution filled in a first bubbler and a second bubbler, respectively.

6. The porous film of claim 3, wherein a ratio of the precursor and the additional precursor injected into the reactor corresponds to the flow rate ratio of a first and a second carrier gas, with which the precursor and the additional precursor can be respectively delivered to the reactor, and is thereby adjusted by the flow rate ratio of a first and a second carrier gas and is controlled within a range of 1:1 to 1:5.

7. The porous film of claim 1, wherein the precursor is tetrakis(trimethylsilyloxy)silane.

8. A semiconductor device with an insulating layer consisting of the porous film of claim 1.

9. A method for preparing a porous film with high hardness and a low dielectric constant formed by plasma polymerization, comprising:

1) depositing a porous film on a substrate by polymerizing a compound represented by Chemical Formula 1 as a precursor through plasma in a reactor with a controlled process pressure under 750 mTorr:

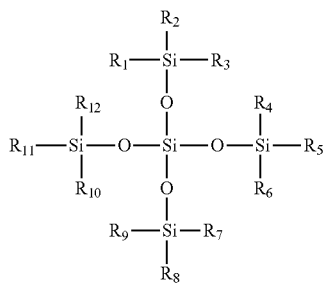

[Chemical Formula 1]

in the formula,
$R_1$ to $R_{12}$ are each independently H or $C_1$-$C_5$ alkyl.

10. The preparation method of claim 9, wherein the step 1) comprises,
A) vaporizing the precursor in a bubbler;
B) supplying the vaporized precursor into a reactor for plasma deposition from the bubbler with a carrier gas; and
C) forming the plasma polymerized film on the substrate in the reactor using the plasma of the reactor.

11. The preparation method of claim 9, wherein the step 1) is performed by a plasma enhanced CVD method.

12. The preparation method of claim 9, wherein the precursor is tetrakis(trimethylsilyloxy)silane.

13. A method for preparing a porous film with high hardness and a low dielectric constant formed by plasma polymerization, comprising:

1) depositing a plasma polymerized film on a substrate by polymerizing a compound represented by Chemical Formula 1 as a precursor with a hydrocarbon compound as an additional precursor through plasma; and
2) annealing the deposited film to sublimate the hydrocarbon compound, thereby forming pores:

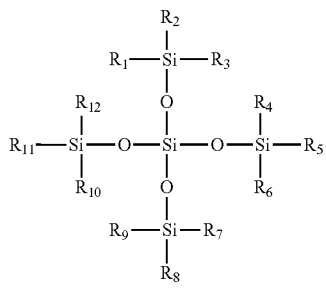

[Chemical Formula 1]

in the formula,
$R_1$ to $R_{12}$ are each independently H or $C_1$-$C_5$ alkyl.

14. The preparation method of claim 13, wherein, in the step 1), the precursor and the additional precursor are provided as a type of solution filled in a first bubbler and a second bubbler, respectively.

15. The preparation method of claim 13, wherein the step 1) is performed by a plasma enhanced CVD method.

16. The preparation method of claim 13, wherein the additional precursor is a $C_6$-$C_{12}$ alkane, an alkene, a cycloalkane, a cycloalkene or a mixture thereof.

17. The preparation method of claim 13, wherein the additional precursor is cyclohexane.

18. The preparation method of claim 13, wherein the precursor is tetrakis(trimethylsilyloxy)silane.

19. The preparation method of claim 13, wherein the step 1) comprises,
   A) independently vaporizing the precursor and the addition precursor in separate bubblers;
   B) supplying the vaporized precursors into a reactor for plasma deposition from the bubblers with a first and a second carrier gas, respectively; and
   C) forming the plasma polymerized film on the substrate in the reactor using the plasma of the reactor.

20. The preparation method of claim 13, wherein the step 2) is performed by heat treatment of plasma polymerized film on a substrate at 300° C. to 600° C.

\* \* \* \* \*